(12) United States Patent
Zhang et al.

(10) Patent No.: US 10,181,523 B2
(45) Date of Patent: Jan. 15, 2019

(54) TRANSISTOR STRUCTURE WITH IMPROVED UNCLAMPED INDUCTIVE SWITCHING IMMUNITY

(71) Applicant: Vishay-Siliconix, Santa Clara, CA (US)

(72) Inventors: Wenjie Zhang, San Jose, CA (US); Madhur Bobde, Sunnyvale, CA (US); Qufei Chen, San Jose, CA (US); Kyle Terrill, Santa Clara, CA (US)

(73) Assignee: Vishay-Siliconix, San Jose, CA (US)

(*) Notice: Subject to any disclaimer, the term of this patent is extended or adjusted under 35 U.S.C. 154(b) by 0 days.

(21) Appl. No.: 15/659,539

(22) Filed: Jul. 25, 2017

(65) Prior Publication Data

US 2018/0212048 A1    Jul. 26, 2018

Related U.S. Application Data

(60) Continuation of application No. 15/093,557, filed on Apr. 7, 2016, now Pat. No. 9,716,166, which is a
(Continued)

(51) Int. Cl.
*H01L 29/78* (2006.01)
*H01L 29/40* (2006.01)
(Continued)

(52) U.S. Cl.
CPC ........ *H01L 29/781* (2013.01); *H01L 29/0623* (2013.01); *H01L 29/0626* (2013.01);
(Continued)

(58) Field of Classification Search
CPC .............. H01L 29/781; H01L 29/0623; H01L 29/66492
(Continued)

(56) References Cited

U.S. PATENT DOCUMENTS 4,663,644 A    5/1987    Shimizu
5,326,711 A    7/1994    Malhi
(Continued)

FOREIGN PATENT DOCUMENTS

CN    103035675    4/2013
DE    10239310    3/2004
(Continued)

*Primary Examiner* — Anthony Ho

(57) ABSTRACT

A laterally diffused metal oxide semiconductor (LDMOS) transistor structure with improved unclamped inductive switching immunity. The LDMOS includes a substrate and an adjacent epitaxial layer both of a first conductivity type. A gate structure is above the epitaxial layer. A drain region and a source region, both of a second conductivity type, are within the epitaxial layer. A channel is formed between the source and drain region and arranged below the gate structure. A body structure of the first conductivity type is at least partially formed under the gate structure and extends laterally under the source region, wherein the epitaxial layer is less doped than the body structure. A conductive trench-like feed-through element passes through the epitaxial layer and contacts the substrate and the source region. The LDMOS includes a tub region of the first conductivity type formed under the source region, and adjacent laterally to and in contact with said body structure and said trench-like feed-through element.

20 Claims, 15 Drawing Sheets

Related U.S. Application Data division of application No. 14/465,697, filed on Aug. 21, 2014, now Pat. No. 9,425,304.

(51) Int. Cl.
  *H01L 29/417*    (2006.01)
  *H01L 29/66*     (2006.01)
  *H01L 29/10*     (2006.01)
  *H01L 29/06*     (2006.01)
  *H01L 21/265*    (2006.01)

(52) U.S. Cl.
  CPC ...... *H01L 29/1045* (2013.01); *H01L 29/1083* (2013.01); *H01L 29/1095* (2013.01); *H01L 29/402* (2013.01); *H01L 29/407* (2013.01); *H01L 29/4175* (2013.01); *H01L 29/41766* (2013.01); *H01L 29/66492* (2013.01); *H01L 29/66659* (2013.01); *H01L 29/66696* (2013.01); *H01L 29/66712* (2013.01); *H01L 29/7835* (2013.01); *H01L 21/26586* (2013.01)

(58) Field of Classification Search
  USPC ........................................................ 438/236
  See application file for complete search history.

(56) References Cited

U.S. PATENT DOCUMENTS

| | | | |
|---|---|---|---|
| 5,473,176 A | 12/1995 | Kakumoto | |
| 5,648,283 A | 7/1997 | Tsang et al. | |
| 5,710,064 A | 1/1998 | Song et al. | |
| 5,742,076 A | 4/1998 | Sridevan et al. | |
| 5,760,440 A | 6/1998 | Kitamura et al. | |
| 5,770,514 A | 6/1998 | Matsuda et al. | |
| 5,866,931 A | 2/1999 | Bulucea et al. | |
| 5,929,481 A | 7/1999 | Hshieh et al. | |
| 5,998,833 A | 12/1999 | Baliga | |
| 6,028,352 A | 2/2000 | Eide | |
| 6,049,108 A | 4/2000 | Williams et al. | |
| 6,057,558 A | 5/2000 | Yamamoto et al. | |
| 6,133,587 A | 10/2000 | Takeuchi et al. | |
| 6,211,018 B1 | 4/2001 | Nam et al. | |
| 6,246,090 B1 | 6/2001 | Brush et al. | |
| 6,246,115 B1 | 6/2001 | Tang et al. | |
| 6,285,075 B1 | 9/2001 | Combs et al. | |
| 6,319,777 B1 | 11/2001 | Hueting et al. | |
| 6,346,438 B1 | 2/2002 | Yagishita et al. | |
| 6,413,822 B2 | 7/2002 | Williams et al. | |
| 6,511,885 B2 | 1/2003 | Harada et al. | |
| 6,521,923 B1 | 2/2003 | D'Anna et al. | |
| 6,552,389 B2 | 4/2003 | Yasuhara et al. | |
| 6,627,950 B1 | 9/2003 | Bulucea et al. | |
| 6,649,975 B2 | 11/2003 | Baliga | |
| 6,652,799 B2 | 11/2003 | Seng et al. | |
| 6,737,704 B1 | 5/2004 | Takemori et al. | |
| 6,764,889 B2 | 7/2004 | Baliga | |
| 6,797,588 B2 | 9/2004 | Ishikawa et al. | |
| 6,838,730 B1 | 1/2005 | Kawaguchi et al. | |
| 6,891,223 B2 | 5/2005 | Krumrey et al. | |
| 6,906,380 B1 | 6/2005 | Pattanayak et al. | |
| 6,919,248 B2 | 7/2005 | Francis et al. | |
| 6,974,750 B2 | 12/2005 | Haase | |
| 7,061,057 B2 | 6/2006 | Babcock et al. | |
| 7,132,734 B2 | 11/2006 | Johnson | |
| 7,138,690 B2 | 11/2006 | Xie et al. | |
| 7,235,845 B2 | 6/2007 | Xu et al. | |
| 7,238,551 B2 | 7/2007 | Kasem et al. | |
| 7,279,743 B2 | 10/2007 | Pattanayak et al. | |
| 7,282,765 B2 | 10/2007 | Xu et al. | |
| 7,344,945 B1 | 3/2008 | Pattanayak et al. | |
| 7,361,558 B2 | 4/2008 | Pattanayak et al. | |
| 7,576,388 B1 | 8/2009 | Wilson et al. | |
| 7,595,017 B2 | 9/2009 | Siegel et al. | |
| 7,833,863 B1 | 11/2010 | Pattanayak et al. | |
| 7,902,646 B2 | 3/2011 | Liu et al. | |
| 7,952,145 B2 | 5/2011 | Korec et al. | |
| 8,018,054 B2 | 9/2011 | Liu et al. | |
| 8,358,017 B2 | 1/2013 | Tsui | |
| 8,368,126 B2 | 2/2013 | Pattanayak et al. | |
| 8,461,669 B2 | 6/2013 | Yang et al. | |
| 8,513,784 B2 | 8/2013 | Lu et al. | |
| 8,581,376 B2 | 11/2013 | Yilmaz et al. | |
| 8,586,419 B2 | 11/2013 | Jaunay et al. | |
| 8,604,525 B2 | 12/2013 | Terrill | |
| 8,604,597 B2 | 12/2013 | Jiang | |
| 8,803,236 B1 | 8/2014 | Lee et al. | |
| 8,822,273 B2 | 9/2014 | Kuo et al. | |
| 8,952,509 B1 | 2/2015 | Yilmaz et al. | |
| 9,064,896 B2 | 6/2015 | Terrill | |
| 9,184,152 B2 | 11/2015 | Kuo et al. | |
| 9,425,304 B2 | 8/2016 | Zhang et al. | |
| 9,716,166 B2* | 7/2017 | Zhang | H01L 29/0623 |
| 2001/0003367 A1 | 6/2001 | Hshieh et al. | |
| 2001/0023959 A1 | 9/2001 | Harada et al. | |
| 2002/0019099 A1* | 2/2002 | Williams | H01L 27/0255 438/270 |
| 2002/0125528 A1* | 9/2002 | Kawaguchi | H01L 29/66666 257/330 |
| 2002/0179945 A1 | 12/2002 | Sakamoto et al. | |
| 2003/0001203 A1 | 1/2003 | Ono et al. | |
| 2003/0006456 A1 | 1/2003 | Takahashi et al. | |
| 2003/0008460 A1 | 1/2003 | Darwish | |
| 2003/0062570 A1 | 4/2003 | Darwish et al. | |
| 2003/0062622 A1 | 4/2003 | Pavier et al. | |
| 2003/0178673 A1 | 9/2003 | Bhalla et al. | |
| 2003/0218209 A1 | 11/2003 | D'Anna et al. | |
| 2004/0063240 A1 | 4/2004 | Madrid et al. | |
| 2004/0108554 A1 | 6/2004 | Hshieh et al. | |
| 2004/0195618 A1 | 10/2004 | Saito et al. | |
| 2005/0017298 A1 | 1/2005 | Xie et al. | |
| 2005/0093097 A1 | 5/2005 | Baiocchi et al. | |
| 2005/0280085 A1 | 12/2005 | Babcock et al. | |
| 2005/0287744 A1 | 12/2005 | Ono et al. | |
| 2006/0060895 A1 | 3/2006 | Hikita et al. | |
| 2006/0220124 A1 | 10/2006 | Ohtake | |
| 2006/0273383 A1 | 12/2006 | Hshieh | |
| 2007/0013008 A1 | 1/2007 | Xu et al. | |
| 2007/0020863 A1 | 1/2007 | Ma et al. | |
| 2007/0034942 A1 | 2/2007 | Xu et al. | |
| 2007/0034944 A1 | 2/2007 | Xu et al. | |
| 2007/0096337 A1 | 5/2007 | Choi | |
| 2007/0132073 A1 | 6/2007 | Tiong et al. | |
| 2007/0278571 A1 | 12/2007 | Bhalla et al. | |
| 2008/0135872 A1 | 6/2008 | Chen et al. | |
| 2008/0142883 A1 | 6/2008 | Grebs et al. | |
| 2008/0197408 A1 | 8/2008 | Disney et al. | |
| 2008/0197411 A1 | 8/2008 | Korec et al. | |
| 2008/0211070 A1 | 9/2008 | Sun et al. | |
| 2008/0233679 A1 | 9/2008 | Luo et al. | |
| 2009/0057869 A1 | 3/2009 | Hebert et al. | |
| 2009/0121331 A1 | 5/2009 | Cruz | |
| 2011/0089485 A1 | 4/2011 | Gao et al. | |
| 2012/0049336 A1 | 3/2012 | Xue et al. | |
| 2012/0119343 A1 | 5/2012 | Bayan et al. | |
| 2012/0126323 A1 | 5/2012 | Wu et al. | |
| 2012/0326287 A1 | 12/2012 | Joshi et al. | |
| 2014/0061884 A1 | 3/2014 | Carpenter et al. | |
| 2014/0077352 A1 | 3/2014 | Leal et al. | |
| 2014/0084429 A1 | 3/2014 | Chen et al. | |
| 2014/0117523 A1 | 5/2014 | Ho et al. | |
| 2014/0191334 A1 | 7/2014 | Xue et al. | |
| 2014/0264611 A1 | 9/2014 | Lee et al. | |
| 2014/0273344 A1 | 9/2014 | Terrill et al. | |
| 2014/0370661 A1 | 12/2014 | Kuo et al. | |
| 2015/0001618 A1 | 1/2015 | Hebert | |
| 2016/0118320 A1 | 4/2016 | Coppone et al. | |

FOREIGN PATENT DOCUMENTS

| | | |
|---|---|---|
| EP | 1170803 | 1/2002 |
| JP | 2001244476 | 9/2001 |
| JP | 2002368121 | 12/2002 |
| JP | 2006086398 | 3/2006 |

(56) References Cited

FOREIGN PATENT DOCUMENTS

| | | |
|---|---|---|
| JP | 2006278832 | 10/2006 |
| JP | 2006286953 | 10/2006 |
| JP | 2007142272 | 6/2007 |
| JP | 2007287813 | 11/2007 |
| JP | 2009124002 | 6/2009 |
| JP | 2011514675 | 5/2011 |
| WO | 9965062 | 12/1999 |

* cited by examiner

TRANSISTOR STRUCTURE WITH IMPROVED UNCLAMPED INDUCTIVE SWITCHING IMMUNITY

CROSS REFERENCE TO RELATED APPLICATIONS

This application is related to U.S. patent application Ser. No. 12/917,172, now U.S. Pat. No. 8,604,525, having a filing date of Nov. 1, 2010 and a priority date of Nov. 2, 2009, which is hereby incorporated by reference in its entirety. This application is a continuation application of U.S. patent application Ser. No. 15/093,557, now U.S. Pat. No. 9,716,166, filed Apr. 7, 2016, by W. Zhang et al., which is a continuation (divisional) application of U.S. patent application Ser. No. 14/465,697, now U.S. Pat. No. 9,425,304, filed Aug. 21, 2014, by W. Zhang et al., which are hereby incorporated by reference in their entirety.

BACKGROUND

In DC-DC power supplies, optimization of the power/control MOSFET (metal oxide semiconductor field effect transistor) requires minimization of both conduction and switching losses. For example, LDMOS (laterally diffused MOSFET) devices have historically been used in RF (radio frequency) applications that require very low switching loss at high frequency.

The semiconductor industry defines ruggedness of a power MOSFET as the capability to withstand avalanche currents when subjected to unclamped inductive switching (UIS). For power switching applications, inductance cannot be avoided in every electrical circuit. That is, in a UIS event, inductance in a circuit that is switched off through a power MOSFET will continue to push current through the power MOSFET. This results in high voltages present across the transistor, which in turn leads to failure of the power MOSFET, such as, avalanche breakdown and high temperatures. As such, this unclamped inductive switching event remains one of the most critical challenges to power MOSFET ruggedness.

One of the key properties of inductance is it will absorb energy from the circuit during a turn-on process, and release the energy into the circuit during a turn-off process. For example, whenever current through an inductance is quickly turned off, the magnetic field inducts a counter electromagnetic force (EMF) that can build up surprisingly high potentials across the corresponding switch. When this UIS event happens, since there is no clamp device to take over the energy stored in the inductance, such huge energy has to be consumed by the power MOSFET device or otherwise fail. That is, when transistors are used as switches, the full buildup of this inducted potential may far exceed the rated breakdown voltage of the transistor, or result in an instantaneous chip temperature reaching a critical value. In either case, the power MOSFET in an uncontrolled UIS event will experience catastrophic failure.

As such, the power MOSFET device must survive and function as usual again after a UIS event is over. For faster power switching, such as within an RF application, UIS immunity becomes more challenging and important.

SUMMARY

In embodiments of the present invention, a semiconductor transistor structure is described. The structure includes a substrate and an epitaxial layer adjacent to the substrate. The substrate and the epitaxial layer are of a first conductivity type. A gate structure is located above the epitaxial layer. A drain region and source region, both of a second conductivity type, are located within the epitaxial layer, such that a channel is formed between the source and drain region in the epitaxial layer. The channel is arranged at least partially below the gate structure. A body structure of the first conductivity type is located within the epitaxial layer, wherein the body structure is at least partially formed under the gate structure and extends laterally under the source region. The epitaxial layer is less doped than the body structure. An electrically conductive trench-like feed-through element that passes through the epitaxial layer and contacts the first conductivity type substrate and passes through and contacts the second conductivity type source region. A tub region of the first conductivity type is formed under the source region, and is adjacent laterally to and in contact with the body structure and also contacts the trench-like feed-through element.

In other embodiments of the present invention, a semiconductor transistor structure is described. The structure includes a substrate and an epitaxial layer adjacent to the substrate. The substrate and the epitaxial layer are of a first conductivity type. A gate structure is located above the epitaxial layer. A drain region and source region, both of a second conductivity type, are located within the epitaxial layer, such that a channel is formed between the source and drain region in the epitaxial layer. The channel is arranged at least partially below the gate structure. The drain region comprises a first region accessible to a drain contact, and is spaced apart from the gate structure. The drain region also comprises a second region that is located at least partially under the first region within the epitaxial layer. The second region is less doped than the first region. Also, the second region extends to at least partially under the gate structure. The second region is coarsely aligned within an edge of the gate structure. A clamp region of a first conductivity type is located under the first region, such that the second region is sandwiched between the first region and the clamp region.

In still other embodiments, a method for fabricating a semiconductor structure is described. The method includes providing a substrate, and forming an epitaxial layer adjacent to the substrate. The substrate and the epitaxial layer are of a first conductivity type. The method includes forming a gate structure located above the epitaxial layer. The method includes forming a drain region and a source region within the epitaxial layer, such that a channel is arranged between the drain and source regions and at least partially below the gate structure. The drain and source regions are of a second conductivity type. The method includes forming a body structure of the first conductivity type within the epitaxial layer, wherein the body structure is at least partially formed under the gate structure and extends laterally under the source region. The method includes forming a tub region under the source region and adjacent laterally to and in contact with the body structure, wherein the tub region comprises the first conductivity type.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTION

Figure 1A:
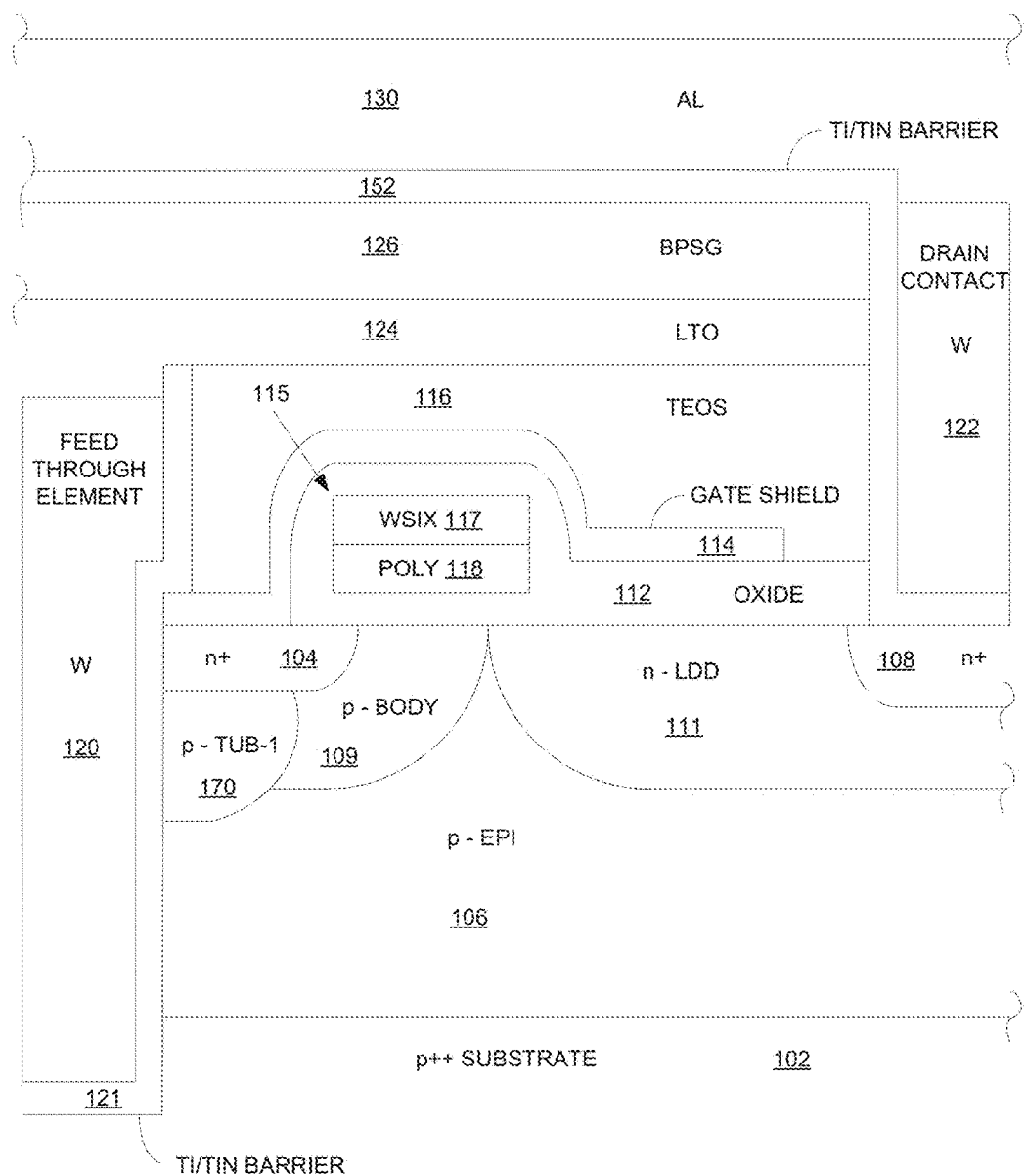
FIG. 1A is a cross-sectional view of a power MOSFET including a p-type tub region located under the source region configured to reduce the lateral resistance across the p-type regions of the MOSFET, in accordance with one embodiment of the present disclosure.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "providing," "extending," "depositing," "etching" or the like, refer to actions and processes of semiconductor device fabrication.

As used herein, the letter "n" refers to an n-type dopant and the letter "p" refers to a p-type dopant. One or more plus signs "+" or one or more minus signs "−" is used to represent, respectively, a relatively high or relatively low concentration of the dopant.

The term "channel" is used herein in the accepted manner. That is, current moves within a field effect transistor (FET) in a channel, between the source connection to the drain connection. A channel can be made of either n-type or p-type semiconductor material; accordingly, a FET is specified as either an n-channel or a p-channel device.

Although described throughout the application in the context of an n-channel device, embodiments according to the present invention are not so limited. That is, the features described herein can be utilized in a p-channel device. As such, the description can be readily mapped to a p-channel device by substituting n-type dopant and materials for corresponding p-type dopant and materials, and vice versa.

Generally during a UIS event, a power MOSFET device is working in an avalanche mode, wherein the drain to source p-n junction of the device is broken down, and the accumulated power in inductance will be dissipated by the avalanche electrical current. This avalanche current will eventually go down to zero, so that the device will recover to a normal state and function as usual as before, unless the parasitic bi-polar transistor is triggered. Once the parasitic bi-polar transistor turns on during the UIS event, the avalanche current will ramp up very quickly, the voltage across the device will drop below the avalanche breakdown voltage, and the power dissipation will heat up the device to over its melting point so that the device physically burns out and fails. Embodiments of the present invention are configured to survive a UIS event by promoting different avalanche current paths through the device while preventing the parasitic bi-polar transistor from turning on.

FIGS. 1A-D are cross-sectional views of power MOSFETs 100A-D in varying configurations capable of improved UIS immunity. That is, each of FIGS. 1A-D include unique features in combination with other common features that promote one or more avalanche current paths during a UIS event. The common features shown in the power MSOFETs 100A-D are described below. Identical features shown in FIGS. 1A-D are identified by similar numbering, and as such perform similar functionality in each of the MOSFETs 100A-D.

The power MOSFETs 100A-D shown in FIGS. 1A-D are laterally diffused MOSFET (LDMOS) devices. In particular, the LDMOS structures connect the source region to a substrate and also to the gate shield. Also, metal feedthroughs (e.g., tungsten) contact the gate shield, n+ source region, and p+ substrate. The tungsten feed-through LDMOS devices shown in FIGS. 1A-D are suitable for RF applications with low power dissipation, and improved UIS event immunity.

In particular, an epitaxial layer 106 is grown over a heavily doped substrate 102. Both the epitaxial layer 106 and the substrate 102 are of a first conductivity type. For instance, as shown in FIGS. 1A-D, a p-type epitaxial layer 106 is grown over a heavily doped (e.g., p++) substrate 102. The epitaxial layer 106 may include additional structures, layers or regions.

A gate structure 115 is located above the epitaxial layer 106. For instance, the gate structure 115 includes a WSix (tungsten silicide) layer 117 and a polysilicon layer 118. As shown, the gate structure 115 is formed over a gate oxide layer 112, such that the polysilicon layer 118 is sandwiched between the gate oxide layer 112 and the tungsten silicide layer 117.

A drain region 108 and a source region 104, both of a second conductivity type, are formed within the epitaxial layer 106. For instance, an n+ drain region 108 is formed and an n+ source region n+ 104 are formed in the MOSFETs 100A-D. During operation, a channel is formed between the source region 104 and the drain region 108 in the epitaxial layer 106. The channel is arranged at least partially below the gate structure 115. As shown, the epitaxial layer 106 and substrate layer 102 are isolated from the drain contact 122 by a reverse-biased junction and the MOSFET channel.

Also, additional implants under the drain region 108 are used to form a lightly doped region of the second conductivity type. For instance, an n-type lightly doped (n-LDD) region 111 extends laterally from at least partially under the gate structure 115 to the drain region 108. The n-LDD region 111 is less doped than the first drain region 108, in one embodiment.

As shown in FIGS. 1A-D, the source region 104 is coarsely aligned with an edge of the gate structure 115. In one embodiment, the source region 104 extends laterally under the gate structure 115 in the epitaxial layer 106.

For improved current flow through the channel, additional implants (not shown) can then be carried out to selectively enhance the epitaxial concentration. For instance, a body structure 109 of the first conductivity type is formed within the epitaxial layer 106. The epitaxial layer 106 is less doped than the body structure. For example, a p-type body structure 109 is formed at least partially under the gate structure 115 within the epitaxial layer 106. The p-type body structure 109 also extends under the source region 104.

Other common features include an oxide layer 112 that is formed in combination with the gate oxide 112 under the gate structure 115. That is, the oxide layer 112 is formed to surround the gate structure 115 on the sides and above.

Also, a gate shield 114 is formed over the oxide layer 112. As shown, the gate shield 114 is formed over the oxide layer 112. Further, the gate shield 114 is in contact with the source region 104, and connected to the source-to-substrate feed-through electrode 120 through the titanium/titanium nitride (TI/TIN) barrier 121 to reduce the electric field between the gate structure 115 and drain region 108 of the device. The gate shield 114 is isolated from the drain contact 122. Barrier 121 lines the interior of the feed-through element 120. For good high frequency performance and enhanced breakdown voltage characteristics, the gate shield resistance is low by connecting the gate shield locally to the source region 104. The gate shield 114 shown is comprised of heavily doped polysilicon.

Further, a TEOS layer 116 is formed above the gate shield 114 and portions of the oxide layer 112. The TEOS layer 116 also contacts the TI/TIN barrier 121. Further, low temperature oxide (LTO) layer 124 is formed over the TEOS layer 116. As shown, the LTO layer 124 is formed over the surfaces of the feed-through element 120 and TEOS layer 116. Also, a borophosphosilicate glass (BPSG) layer 126 is formed over the LTO layer 124.

A barrier layer 152 is formed that lines the trench used for the drain contact 122, and extends over the surface of the BPSG layer 126. In one embodiment, the barrier layer 152 comprises a Ti layer and a TiN layer. The trench is filled with tungsten to form the drain contact 122.

The drain contact 122 and the source-to-substrate feed-through element 120 are filled with tungsten in one embodiment. Tungsten provides a better thermal coefficient match with silicon and lower resistance over formations of doped silicon.

A metal layer 130 is formed over the barrier 152. The metal layer 130 contacts the drain contact 122. For example, metal layer 130 includes a titanium layer and aluminum layer, taken alone or in combination. As such, the feed-through element 120 is separated from the metal layer 130 by the LTO layer 124 and the BPSG layer 126.

The MOSFET devices 100A-D are operated by applying an electrical potential to the gate structure 115 to complete a circuit that includes, but is not limited to, the source contacts (not shown), the source region 104, the drain region 108, the structures in the epitaxial layer 106, the substrate layer 102, the drain contact 122, and the feed-through element 120.

When switching to an off state, the MOSFET devices 100A-D generate two avalanche current paths—a lateral current path and a vertical current path. MOSFETs 100A and 100B of FIGS. 1A-B promote a lateral current path that does not turn on the n-p-n junction of the device, and MOSFETs 100C and 100D of FIGS. 1C-D promote the vertical current path.

Now referring to FIG. 1A, a lateral current is promoted that avoids the source region 104, thereby avoiding turning on the parasitic bipolar n-p-n (drain-body-source) transistor during a UIS event. A lateral avalanche current is generated, which when controlled properly is configured to dissipate the accumulated power stored in the inductor. Through proper configuration of the p-type areas in the MOSFET 100A, the lateral avalanche current is controlled such that the parasitic bipolar transistor is not turned on. However, should the parasitic bipolar transistor turn on across the drain to source, the lateral avalanche current will spike quickly and heat up the device to over its melting point. Also, should the parasitic bipolar transistor turn on, the voltage would collapse below the breakdown voltage during the UIS event, and the device would fail to meet specification requirements. Embodiments of the present invention control the lateral avalanche current by reducing the resistance across the p-type areas under the source region 104.

As such, the power MOSFET 100A is configured to reduce the body area 109 resistance, or put another way reduces the lateral resistance across the device. This promotes a controlled lateral current through the body area that does not turn on the n-p-n junction formed with the source region thereby keeping the voltage above the breakdown voltage at critical stages during the UIS event. In particular, reduction of body area 109 resistance is accomplished by forming additional p-type doping areas, such as, the tub region 170 of FIG. 1A.

Specifically, FIG. 1A is a cross-sectional view of a power MOSFET 100A including a first tub region 170 of a first conductivity type that is formed under the source region, and adjacent laterally to and in contact with the body structure, in accordance with one embodiment of the present disclosure. In FIG. 1A, the first tub region 170 is shown as p-type, and is located under the source region 104. The first p-type tub region 170 is configured to reduce the lateral resistance across the p-type regions (e.g., p-body 109, p-tub-1 170, and epitaxial layer 106) of the MOSFET 100A. The reduction in resistance in the p-body through the first tub region 170 promotes a lateral avalanche current path that starts from the drain region 108 and proceeds along the n-LDD region 111, through the p-body 109 and the first tub region 170, through the feed-through element 120 and out the substrate 102. The electrically conductive trench-like feed-through element 120 passes through the epitaxial layer 106 and contacts the first conductivity type substrate 102, and also contacts the second conductivity type source region 104. In one embodiment, a TiTiN barrier 121 is adjacent to the feed-through element 120. Note that the avalanche current path avoids the source region 104, thereby keeping the n-p-n junction of the parasitic bipolar transistor in an off state.

In one embodiment, the highly doped first tub region 170 is formed at least partially below the source region 104, and adjacent laterally to and in contact with the body structure 109. Also, the first tub region 170 is adjacent to and in contact with the barrier 121 and feed-through element 120. That is, the barrier 121 and feed-through element 120 are treated as one structure. The body structure 109 is less doped than the first tub region 170, in one embodiment. In other embodiments, the first tub region 170 extends laterally under the source 104 and further under the gate structure 115.

Figure 1B:
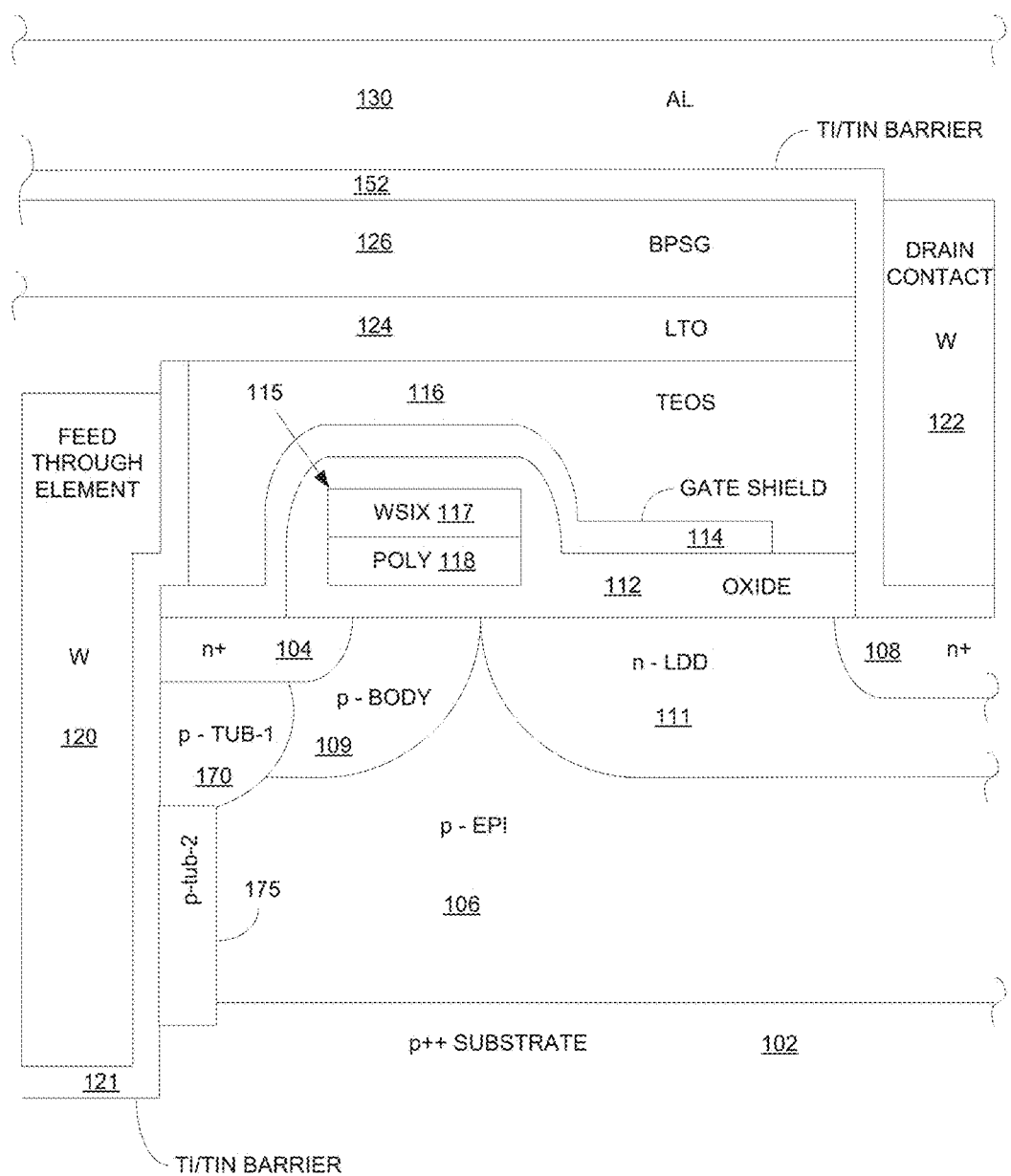
FIG. 1B is a cross-sectional view of a power MOSFET including p-type first and second tub regions under the source region configured to reduce the lateral resistance across the p-type regions of the MOSFET, in accordance with one embodiment of the present disclosure.

Now turning to FIG. 1B, a further reduction of the lateral resistance across the p-type regions of a power MOSFET is shown in the cross-sectional view of a power MOSFET 100B including first tub region 170 and second tub region 175 of a first conductivity type, in accordance with one embodiment of the present disclosure. The additional second tub region 175 further reduces the resistance of the body area 109 located under the source region 104. In that is manner, second tub region 175 promotes a controlled lateral current through the body area that does not turn on the n-p-n junction formed with the source region, which keeps the voltage above the breakdown voltage at critical stages during a UIS event.

As shown in FIG. 1B, the p-type second tub region 175 is formed at least partially below the first tub region 170, and is also formed adjacent to and in contact with the feed-through element 120 and barrier 121. Also, the second tub region 175 is formed in such a manner to contact the substrate 102, or put another way, tub region 175 is configured to reach all the way down to the p-type buffer or substrate layer 102. In some embodiments, the first tub region 170 and the second tub region extend laterally into the p-type epitaxial layer 106 under the source region 104 and further under the gate structure 115.

In one embodiment, the second tub region 175 is less doped than the first tub region 170. Also, the p-type body structure 109 is less doped than each of the first tub region 170 and the second tub region 175. The reduction in resistance in the p-body 109 through the first and second tub regions 170 and 175, respectively, promotes a lateral avalanche current path that starts from the drain region 108 and proceeds along the n-LDD region 111, through the p-body 109, first tub region 170, the second tub region 175, through the feed-through element 120, and out the substrate 102. Note that the avalanche current avoids the source region 104, thereby keeping the n-p-n junction of the parasitic bipolar transistor in an off state.

Figure 1C:
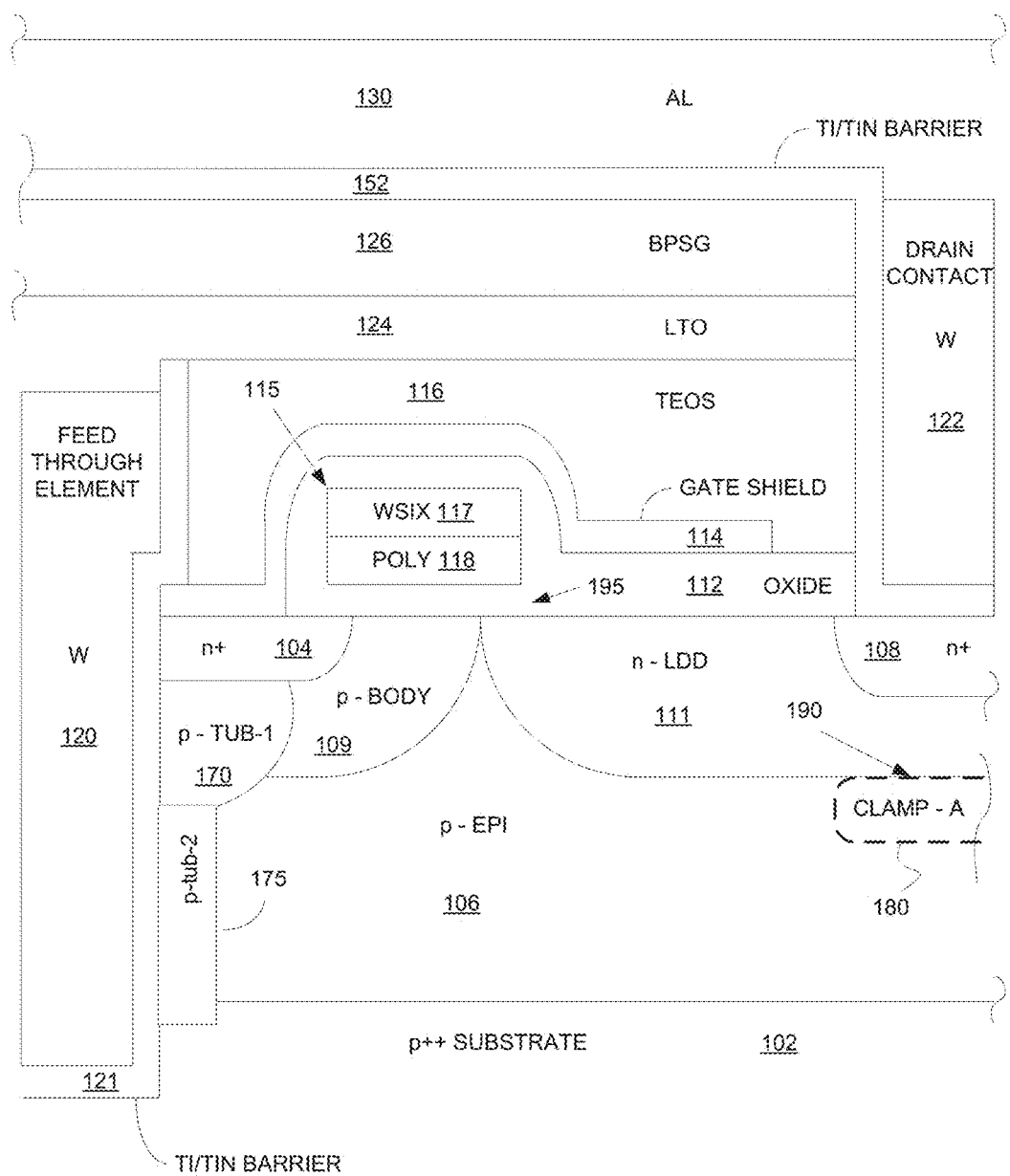
FIGS. 1C and 1D are cross-sectional views of power MOSFETs, each including a p-type clamp region under the drain region and LDD (lightly doped drain) region configured to clamp the voltage across the drain source junction, in accordance with embodiments of the present disclosure.
Figure 1D:
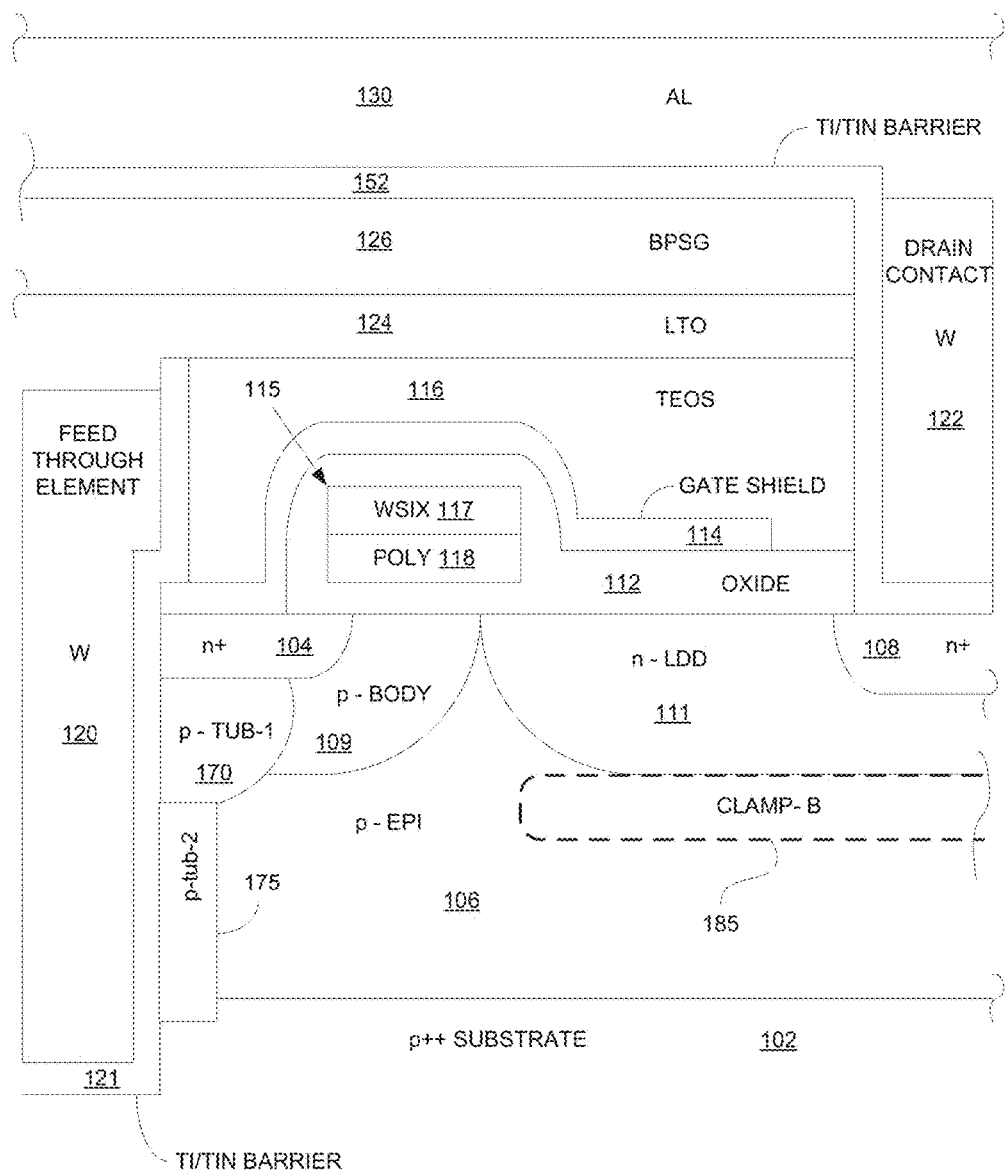

FIGS. 1C and 1D are cross-sectional views of power MOSFETs 100C and 100D, each including a clamp region of a first conductivity type under the drain region and LDD region configured to clamp the voltage across the drain source junction, in accordance with embodiments of the present disclosure. MOSFETs 100C and 100D are configured to promote vertical avalanche current paths during a UIS event. More particularly, an increase in the current over the vertical current path in a corresponding MOSFET is able to reduce the total amount of current flowing in the lateral avalanche current path. Reducing the current in the lateral path further ensures that the parasitic bipolar n-p-n transistor formed with the source region 104 remains in an off state during a UIS event.

During a UIS event, two locations in a MOSFET device occur having high electric fields. The electric field generated in the area indicated by arrow 195 promotes a lateral avalanche current across a p-n junction formed with the gate structure 115. The electric field generated in the area indicated by arrow 190 promotes a vertical avalanche current across a p-n junction formed between the n-LDD 111 and the p-type epitaxial layer 106. Embodiments of the present invention promote a vertical avalanche current over a lateral avalanche current by increasing the electrical field across the p-n junction in the area indicated by arrow 190. For instance, the current ratio between the lateral avalanche current and the vertical avalanche current is related to the ratio of the electrical fields at the two locations indicated by arrow 190 and 195. Favoring a higher electric field in the area indicated by arrow 190 over an electric field in the area indicated by arrow 195 promotes a higher vertical avalanche current over a corresponding lateral avalanche current.

MOSFET 100C of FIG. 1C is configured to reduce the lateral avalanche current by lowering the maximum lateral electrical field when compared to the maximum vertical electrical field during a UIS event. This is achieved by clamping the drain-to-source junction. In particular, a higher doped clamp region 180 (clamp-A) of a first conductivity type is located under a drain.

As shown in FIG. 1C, the drain comprises a first drain region 108 accessible to a drain contact 122. The first drain region 108 is spaced apart from the gate structure 115. The drain also comprises a second drain region (n-LDD 111) that is less doped than the first drain region 108. The second drain region 111 is located under the first drain region within the epitaxial layer 106. The second drain region 111 extends to at least partially under the gate structure 115.

In FIG. 1C, clamp region 180 is of a p-type and is located under the first drain region 108, such that the second drain region (n-LDD 111) separates the first drain region 108 and the clamp region 180. In one embodiment, the p-type epitaxial layer 106 is less doped than the p-type clamp region 180. The clamp region 180 is formed within the epitaxial layer 106. In one embodiment, the clamp region 180 is coarsely aligned with an edge of the first drain region 108. As such, the clamp region 180 is configured to increase the vertical electric field over a lateral electric field in the MOSFET 100C. In that manner, a vertical avalanche current path is promoted that starts from the first drain region 108 and proceeds through the n-LDD region 111, through the clamp region 180, through the epitaxial layer 106, and to the substrate 102.

MOSFET 100D of FIG. 1D is also configured to reduce the lateral avalanche current by lowering the maximum lateral electrical field when compared to the maximum vertical electrical field during a UIS event. This is achieved by also clamping the drain-to-source junction. In particular, a higher doped clamp region 185 (clamp-B) of a first conductivity type is located under a drain. Clamp region 185 of FIG. 1D extends more laterally than clamp region 180 of FIG. 1C. That is, clamp region 185 is extended more laterally from the first drain region 108 towards the gate structure 115 in the epitaxial layer 106.

In FIG. 1D, the n-type clamp region 185 is located under the second drain region 111. As such, the second drain region (n-LDD 111) is sandwiched between the first drain region 108 and the clamp region 185. The clamp region 185 is formed within the epitaxial layer 106. In one embodiment, the clamp region 185 is coarsely aligned with an edge of the second drain region 111. The clamp region 185 is configured to increase the vertical electric field over a lateral electric field in the MOSFET 100D. In that manner, a vertical avalanche current path is promoted that starts from the first drain region 108 and proceeds through the n-LDD region 111, through the clamp region 180, through the epitaxial layer 106, and to the substrate 102.

Embodiments of the present invention improve UIS event immunity by reducing the body area resistance (e.g., MOSFETs 100A and 100B) and/or by reducing the lateral avalanche current by promoting more vertical avalanche currents (e.g., MOSFETs 100C and 100D). Embodiments of the present invention support various configurations including one or more of the following: tub region 170, tub region 175, clamp region 180, and clamp region 185.

Figure 2:
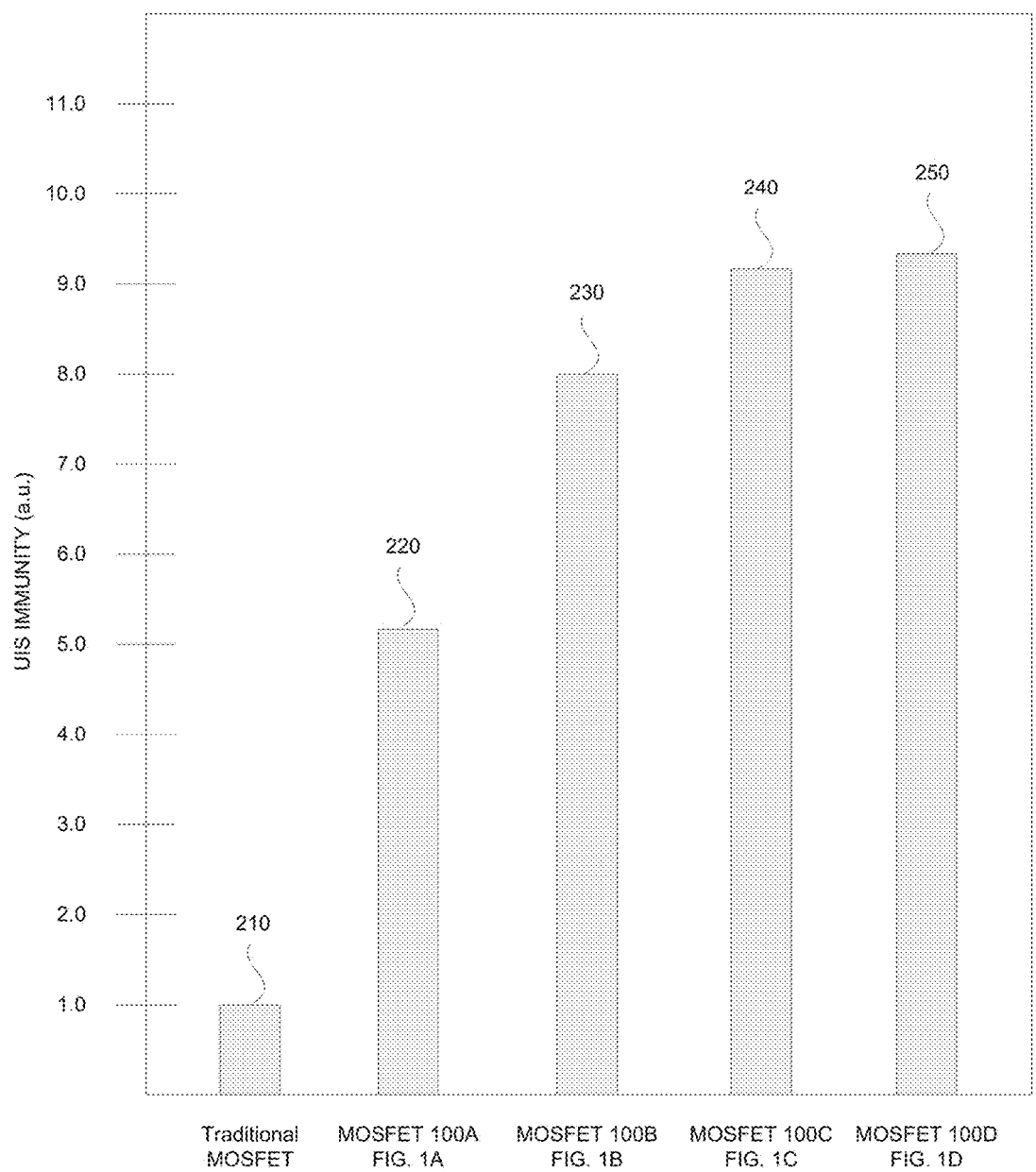
FIG. 2 is a graph illustrating device UIS immunity results for power MOSFETs described in FIGS. 1A-D, in accordance with one embodiment of the present disclosure.

FIG. 2 is a graph 200 illustrating device UIS immunity results for power MOSFETs described in FIGS. 1A-D, in accordance with embodiments of the present disclosure. As shown, bar 210 shows the UIS immunity response for a traditional power MOSFET that does not include any of the features (e.g., tub and/or clamp regions) described in embodiments of the present invention. Also, bar 220 shows the UIS immunity response for MOSFET 100A of FIG. 1A, in one embodiment of the present invention. The UIS immunity response shown in bar 220 is approximately five times better than that for a traditional power MOSFET, shown in bar 210. Further, bar 230 shows the UIS immunity response for MOSFET 100B of FIG. 1B, in one embodiment. As shown MOSFET 100B has a better UIS immunity response than MOSFET 100A. Bar 240 shows the UIS immunity response for MOSFET 100C of FIG. 1C, and bar 250 shows the UIS immunity response for MOSFET 100D of FIG. 1D. As shown, the UIS immunity response for MOSFET 100D is slightly better than that for MOSFET 100C. However, the UIS immunity responses for both MOSFET 100C and 100D are about nine times better than the UIS immunity response of a traditional MOSFET device.

Figure 3:
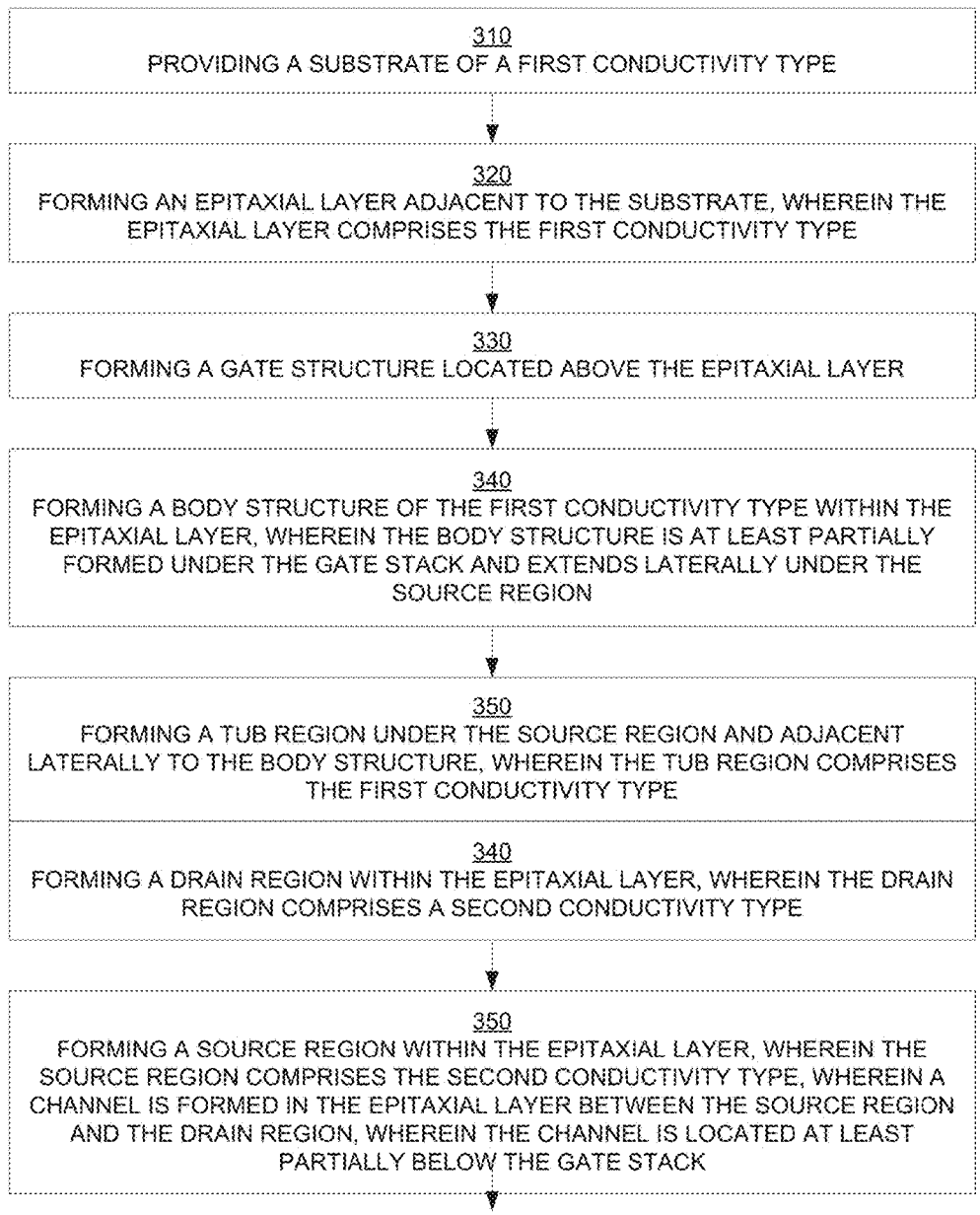
FIG. 3 is a flow diagram illustrating a method for fabricating a power MOSFET including a p-type tub region located under the source region that is configured to reduce the lateral resistance across the p-type regions of the MOSFET, in accordance with one embodiment of the present disclosure.

FIG. 3 in combination with FIGS. 4A-I illustrate a process for fabricating a power MOSFET device, according to embodiments of the present invention. Although specific steps are disclosed, such steps are only examples. That is, embodiments according to the present invention are well suited to performing various other steps or variations of the recited steps. Figures are not drawn to scale, and only portions of the structures, as well as the various layers that form those structures, may be shown in the figures. Furthermore, additional fabrication processes and steps may be performed along with the processes and steps discussed herein. That is, there may be a number of process steps before, in between and/or after the steps shown and described herein. Also, the order of the steps may be different than that described herein. Embodiments in accordance with the present invention can replace or be used in conjunction with portions of a conventional device or process without significantly affecting peripheral structures, processes and steps.

In particular, FIG. 3 is a flow diagram 300A illustrating a method for fabricating a power MOSFET configured for reducing the lateral resistance across a body area under a source region, and/or increasing the vertical avalanche current, in accordance with embodiments of the present disclosure. In particular, flow diagram 300A provides for the fabrication of a power MOSFET device that includes a tub region located under a source region. Also, FIGS. 4A-I are cross-sectional views showing elements of a power MOSFET device configured for improved UIS immunity at various fabricating stages, in accordance with embodiments of the present disclosure.

Figure 4A:
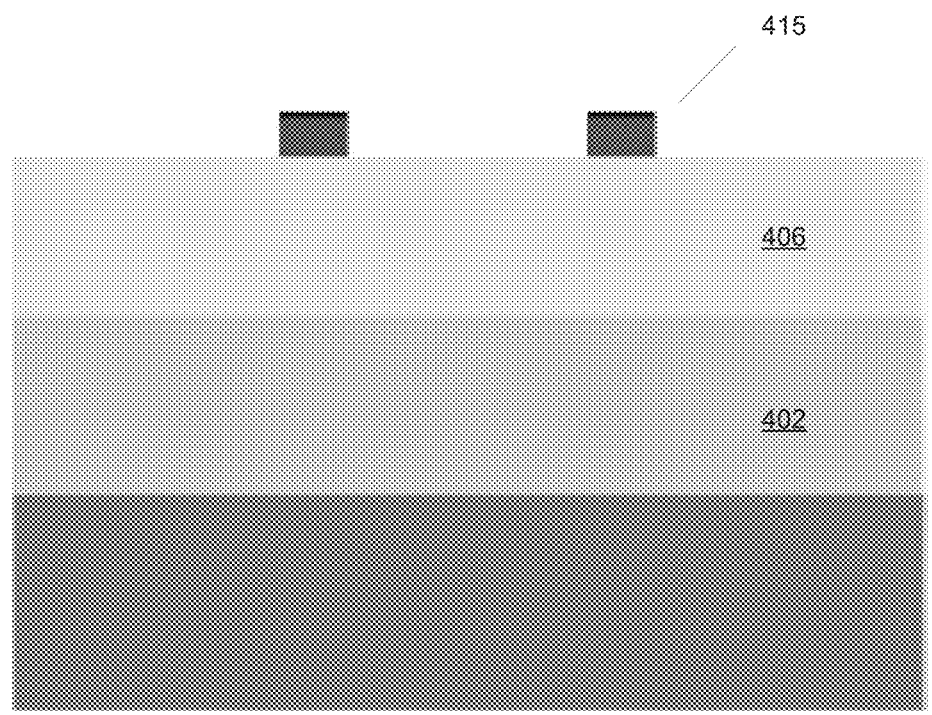
FIGS. 4A-4I are cross-sectional views showing elements of a power MOSFET device configured for improved UIS immunity at various fabricating stages, in accordance with embodiments of the present disclosure.

At 310, the method includes providing a substrate of a first conductivity type. For instance, for an n-channel device, the first conductivity type comprises a p-type. Also, for a p-channel device, the first conductivity type comprises an n-type. Consistent with FIGS. 4A-I, a highly doped p++ substrate is provide. For instance, FIG. 4A is a diagram showing a cross section of a preliminary stage 400A in the fabrication of a MOSFET, and includes a p++ substrate 402.

At 320, the method includes forming an epitaxial layer adjacent to the substrate, wherein the epitaxial layer comprises the first conductivity type. For instance, a p-type epitaxial layer 406 is grown over a heavily doped (e.g., p++) substrate 402, as is shown in FIG. 4A. Additional p-type implants (not shown) can be carried out to selectively enhance the epitaxial concentration.

A sacrificial oxide layer (not shown) can be grown and stripped. A gate oxide layer is then grown. The gate oxide layer may be combined with an oxide layer surrounding a later formed gate structure.

Doped polysilicon and WSix (tungsten silicide) is then deposited over the gate oxide as a prelude to forming a gate structure. In some embodiments, only the doped polysilicon layer is deposited, such that a later formed gate structure does not include WSix. For instance, gate structure 415 is shown deposited over the epitaxial layer 406 in FIG. 4A. Formation of the gate structure 415 includes in one embodiment a photolithographic process to selectively deposit photoresist (not shown) over the area where the gate structure is to be formed. A plasma etch step can be used to remove the WSix and doped polysilicon outside of the area where the gate structure is formed. Etching is performed so that at least some of the gate oxide layer remains. In that manner, the method at 330 includes forming a gate structure 415 including a WSix layer and a polysilicon layer that is located above the epitaxial layer 406.

Figure 4B:
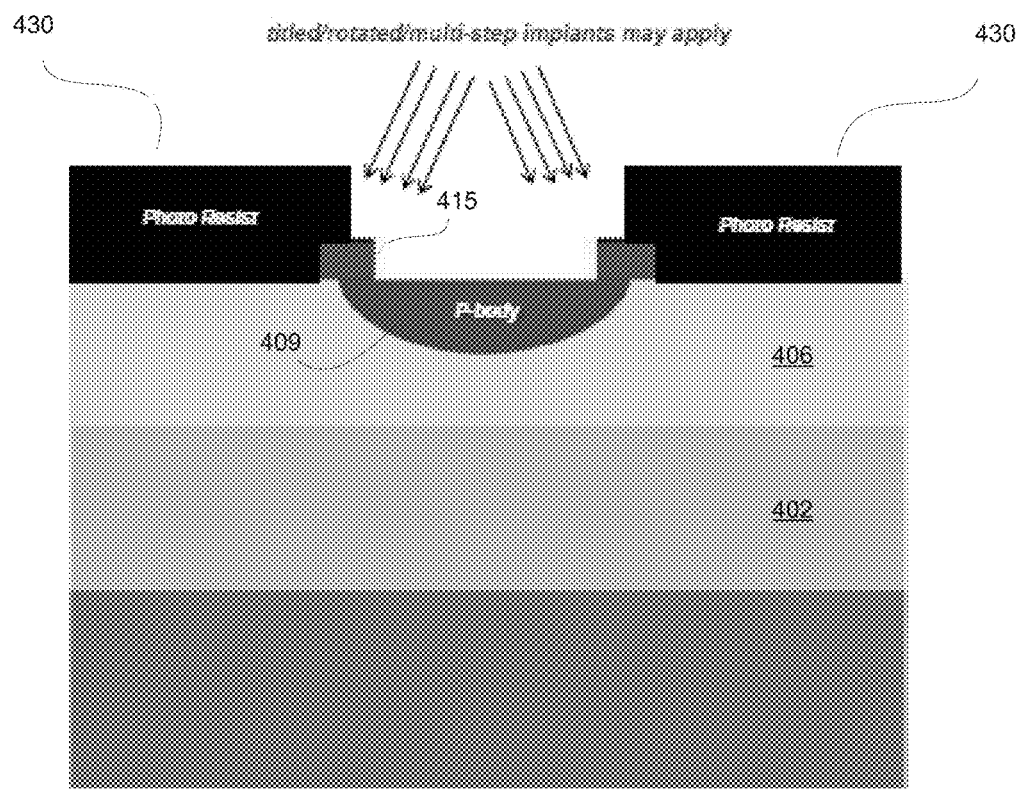

Additional implant steps are performed to form additional structures in the epitaxial layer 406. For example, another photolithographic process can be used to selectively deposit photoresist in all areas outside a region where a body region is to be formed. In particular, at 340, the method includes forming a body structure of the first conductivity type in the epitaxial layer, wherein the body structure is at least partially formed under the gate stack and extends laterally under the source region. As shown in FIG. 4B, a p-type body region 409 is implanted. A combination of vertical and angled implants can be used to form the body region 409. In one implementation, the p-type body implant is self aligned to an edge of the gate structure 415. After cleaning the wafer, an implant anneal or body drive can be performed. Another oxide layer is created on the sides of the gate structure 415 using either thermal oxidation or oxide spacer formation techniques.

Figure 4C:
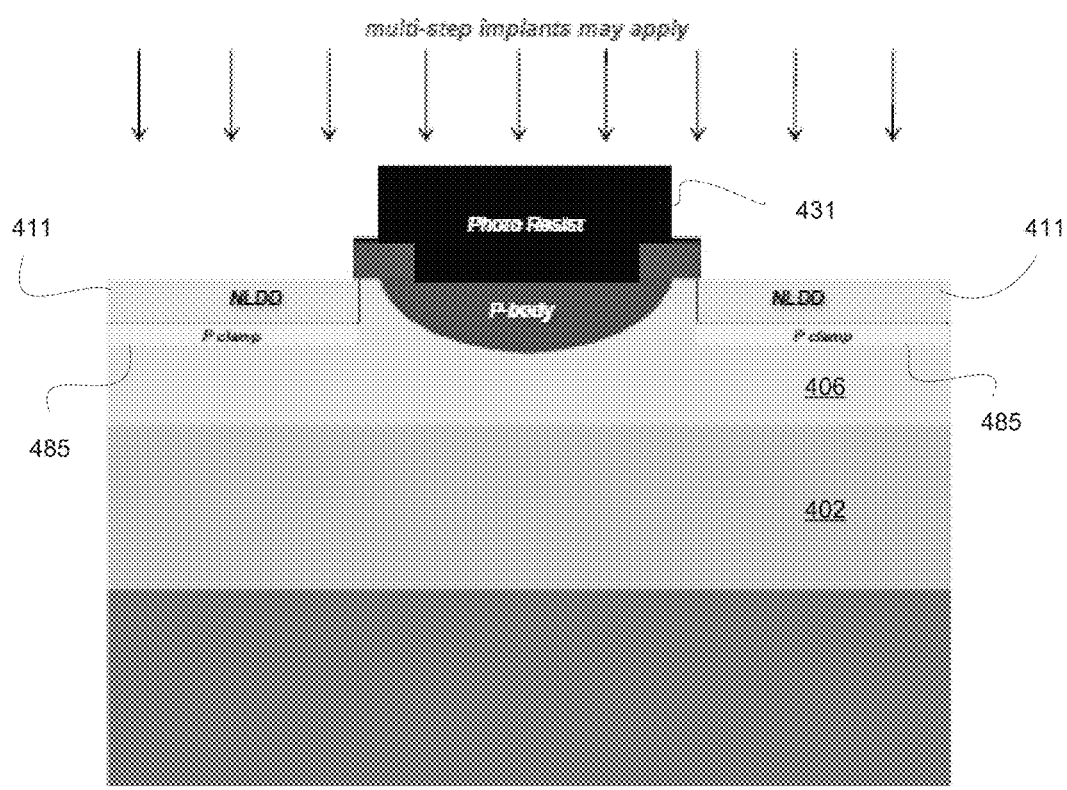

At 350, the method includes forming a tub region under the source region and adjacent laterally to and in contact with the body structure, wherein the tub region is of the first conductivity type. That is, following body implants, a photo lithographic process is used to leave photo resist outside of the tub region. For instance, FIG. 4C is a diagram showing a cross section of an intermediate stage 400C in the fabrication of a MOSFET, and includes photoresist 432 deposited in areas outside of the formation of a p-type tub region. Photoresist 432 leaves a gap that is narrower than the area occupied by the p-type body region 409. The p-type tub region is formed by several steps of different energy implants with different dosage combinations. For instance, a first p-type tub region 470 is shown closer to the surface of the epitaxial layer 406, and a second p-type tub region 475 is shown further from the surface of the epitaxial layer 406. The second p-type tub region 475 is less doped than the first p-type tub region 470, in one embodiment.

After cleaning the wafer, an implant anneal or body drive can be performed. For instance, a high temperature anneal step is performed to drive the p-type implant deeper of the body 409, and the tub region 470 and 475 deeper within the epitaxial layer 406.

Figure 4D:
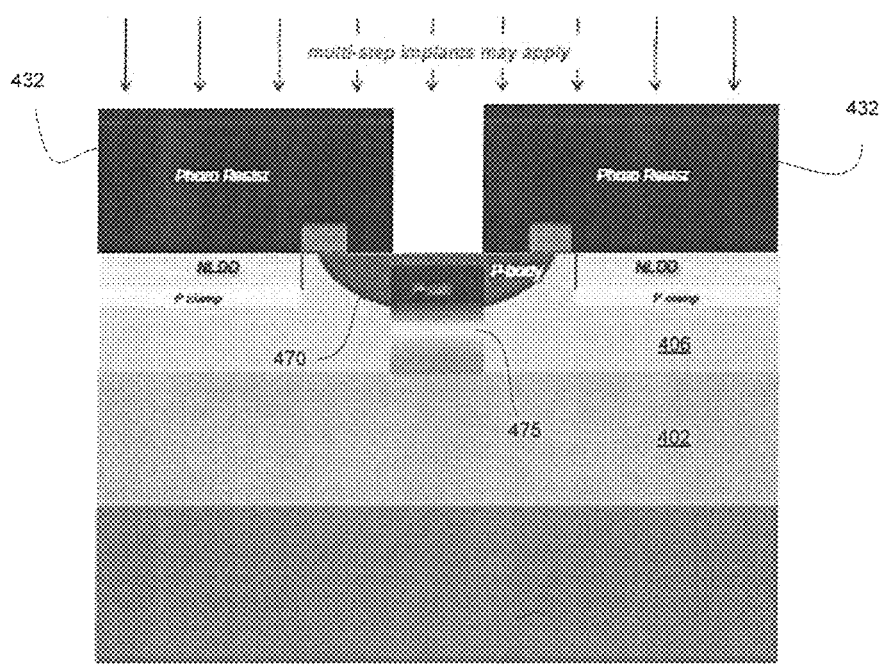

At 360, a photolithographic process can be used to selectively deposit photoresist 431 in all areas outside a region where an n-LDD region is to be formed. One or more implants are used to form the extended drain LDD region. For instance, FIG. 4D is a diagram showing a cross section of an intermediate stage 400D in the fabrication of a power MOSFET. An n-type implant is performed to form the n-LDD region 411.

In one embodiment, an additional p-type implant is introduced to form the clamp region underneath the n-LDD before stripping the photoresist 431. For instance, the p-type implant is performed to form the p-type clamping region 485 in FIG. 4D. By doing this, one masking step is saved to form the clamping region 485. Should a smaller clamping region be formed under the drain region (e.g., clamp region 180 of FIG. 1C), an additional masking step would be required that is separate from the masking step used to form the source and drain regions.

Figure 4E:
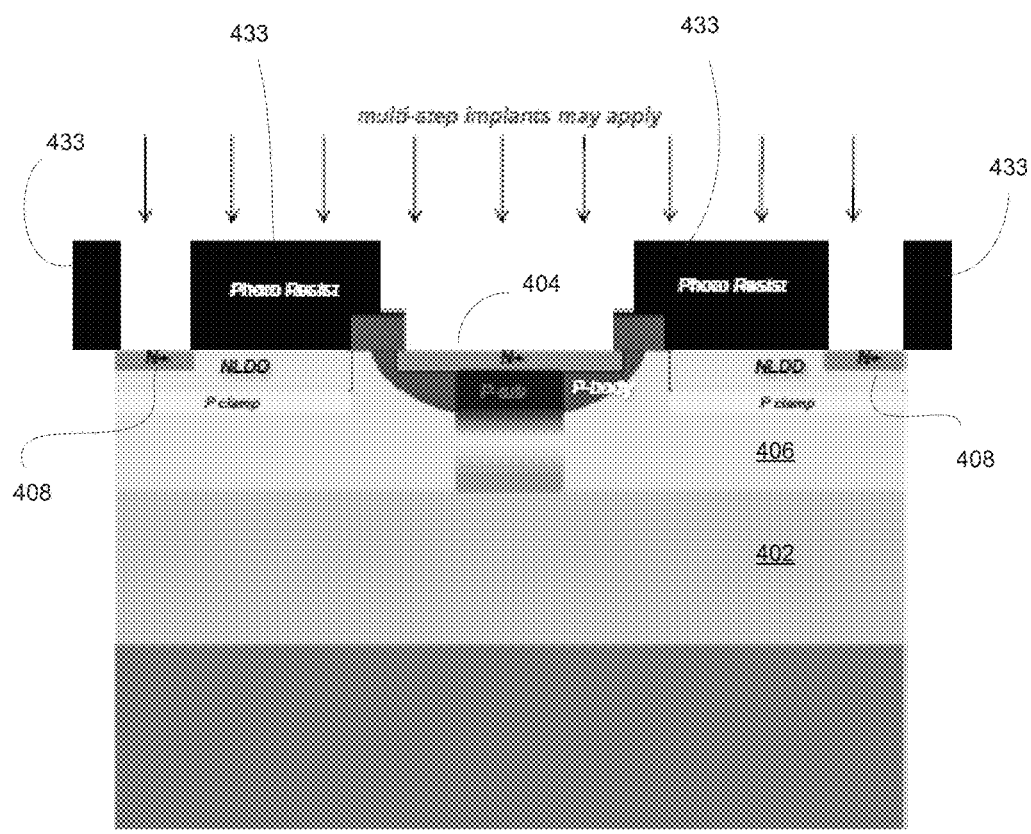

At 370, a photolithographic process can be used to selectively deposit photoresist in all areas outside a region where a source and drain region are to be formed. For instance, FIG. 4E is a diagram showing a cross section of an intermediate stage 400E in the fabrication of a power MOSFET, and a source region 404 is formed. As an example, an arsenic n-type implant can be used to form the source region 404 and drain region 408. After cleaning, a source implant anneal can be performed.

Figure 4F:
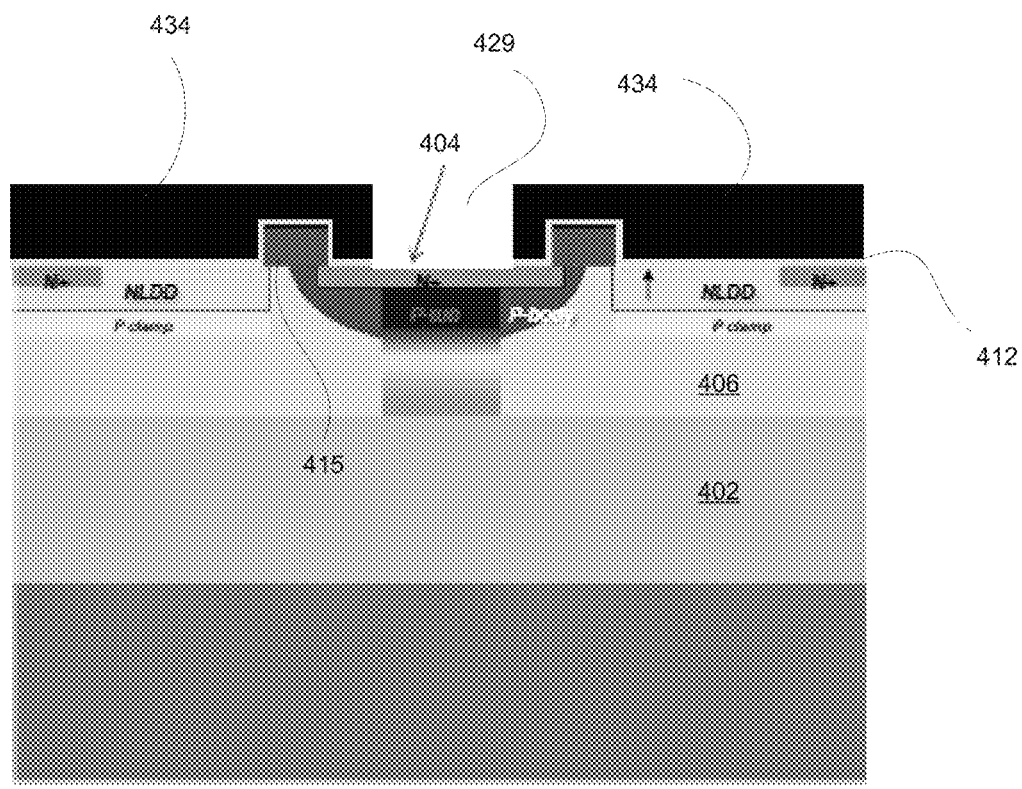

Plasma or TEOS (tetraethyl orthosilicate) oxide is deposited and annealed to compete the gate shield oxide layer. For instance, FIG. 4F is a diagram showing a cross section of an intermediate stage 400F in the fabrication of a power MOSFET. A gate shield oxide layer 412 is shown surrounding a gate structure 415.

In one embodiment, a photolithographic process is used to selectively deposit photoresist in areas except for the gate shield to source contact region. For example, photoresist 434 is deposited in areas to expose the gate shield to source contact region 429, as is shown in FIG. 4F. The gate shield oxide 412 is then etched in this region, thereby exposing the underlying source region 404.

Figure 4G:
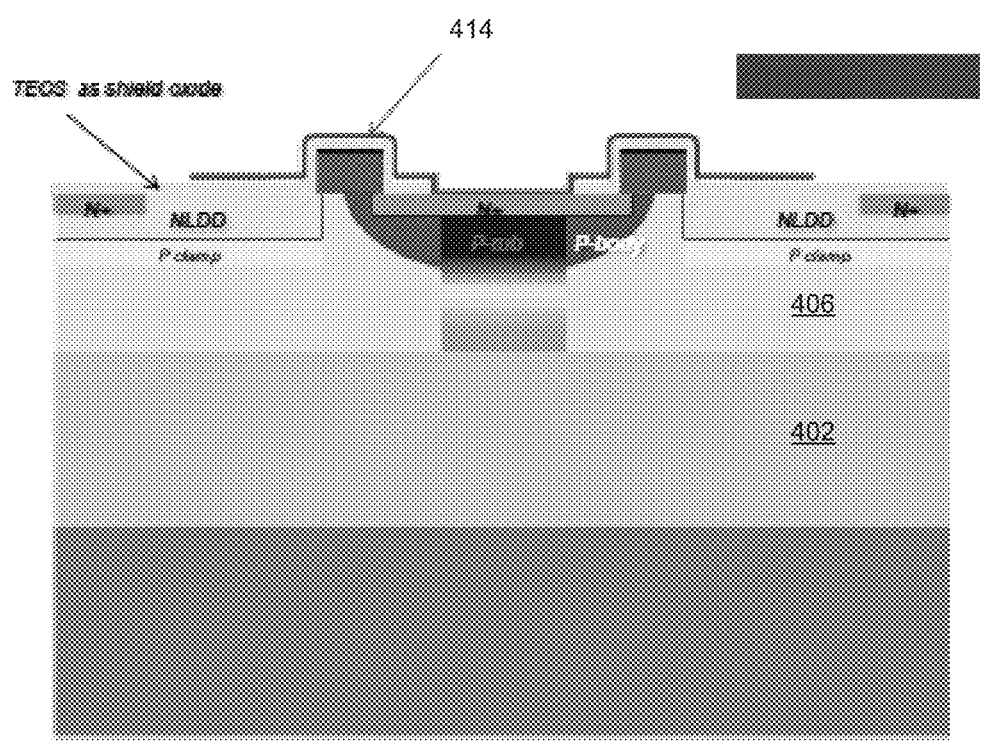

After cleaning the wafer and using a dilute HF (hydrofluoric acid) last pretreatment, a doped polysilicon gate shield is then deposited, in one embodiment. For instance, FIG. 4G is a diagram showing a cross section of an intermediate stage 400G in the fabrication of a power MOSFET including a polysilicon gate shield 414. The gate shield 414 is deposited over the remainder of the oxide layer 412 and over the source region 404. As shown, the gate shield 414 is in contact with the underlying source region 404.

Figure 4H:
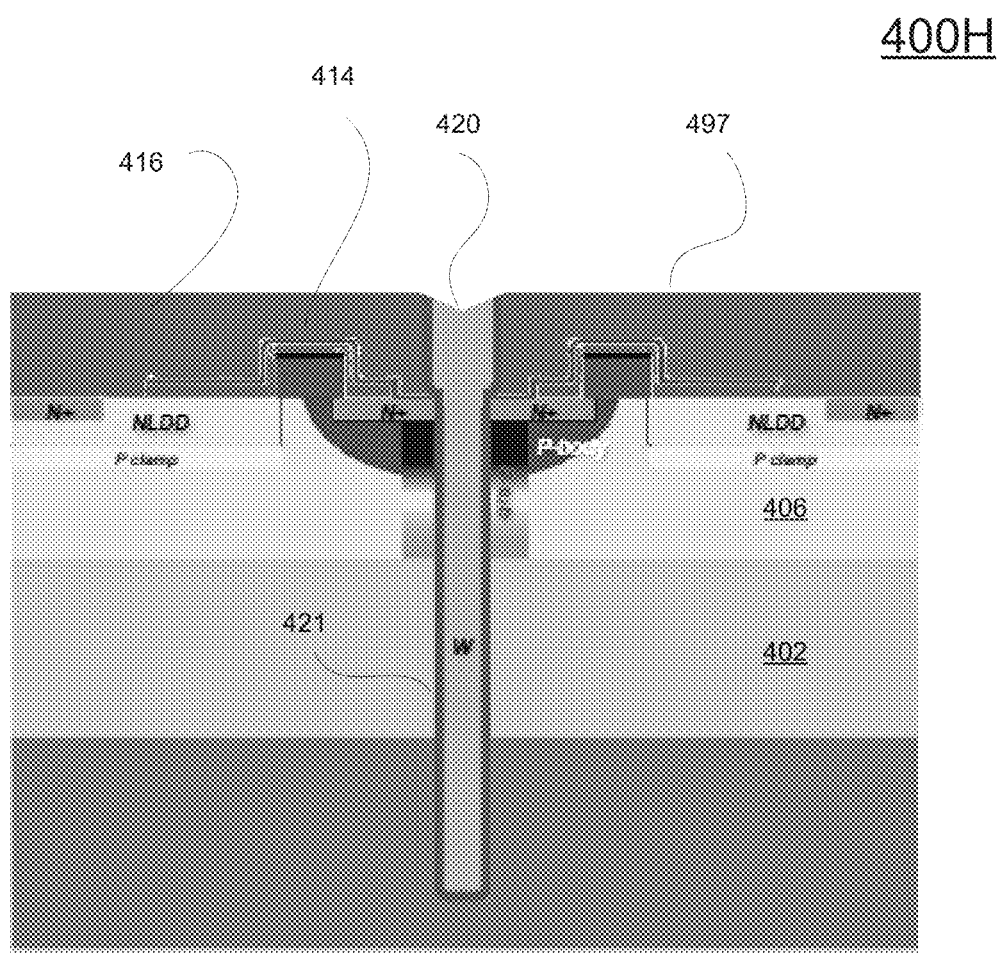

Another photolithographic process is used to selectively deposit photoresist over the gate shield except for an area above the drain region of the MOSFET. A plasma etch step can be used to remove the gate shield material 414 in the desired and exposed region. After cleaning the wafer, a relatively thick TEOS layer 416 is deposited. For instance, FIG. 4H is a diagram showing a cross section of an intermediate stage 400H in the fabrication of a power MOSFET including a TEOS layer 416. As shown, the TEOS layer 416 is etched back to form a planar surface 497 without exposing the gate shield material 414.

A source-to-substrate feed-through element is formed. For instance, a photolithographic process is used to selectively deposit photoresist (not shown) in areas outside the area where the source-to-substrate feed-through contact is to be formed. In one implementation, a two-step plasma etch can be used to etch a trench for the feed-through contact. First, a plasma oxide etch can be used to etch the TEOS layer on top of the epitaxial layer. Then, a plasma silicon etch can be used to form the trench through the epitaxial layer and extending into the p++ substrate 402. After cleaning the wafer and using a dilute HF last pretreatment, the upper portion of the trench is wider than the lower portion, forming a ledge at the point where the gate shield 414 meets the feed-through element 420. A conformal coating of titanium (Ti) layer and titanium-nitride (TiN) layer 421 can be deposited to line the sides and bottom of the trench, followed by a rapid thermal anneal to form a titanium-silicide contact.

A CVD tungsten (W) layer 420 can then be deposited into the trench to form the feed-through element 420. The tungsten layer is thick enough to completely fill the trench. In one implementation, the tungsten is etched back to planarize the tungsten, so that it only remains inside the feed-through contact region. A plasma etch is then used to remove the titanium and titanium-nitride layers that are exposed without etching the tungsten.

Figure 4I:
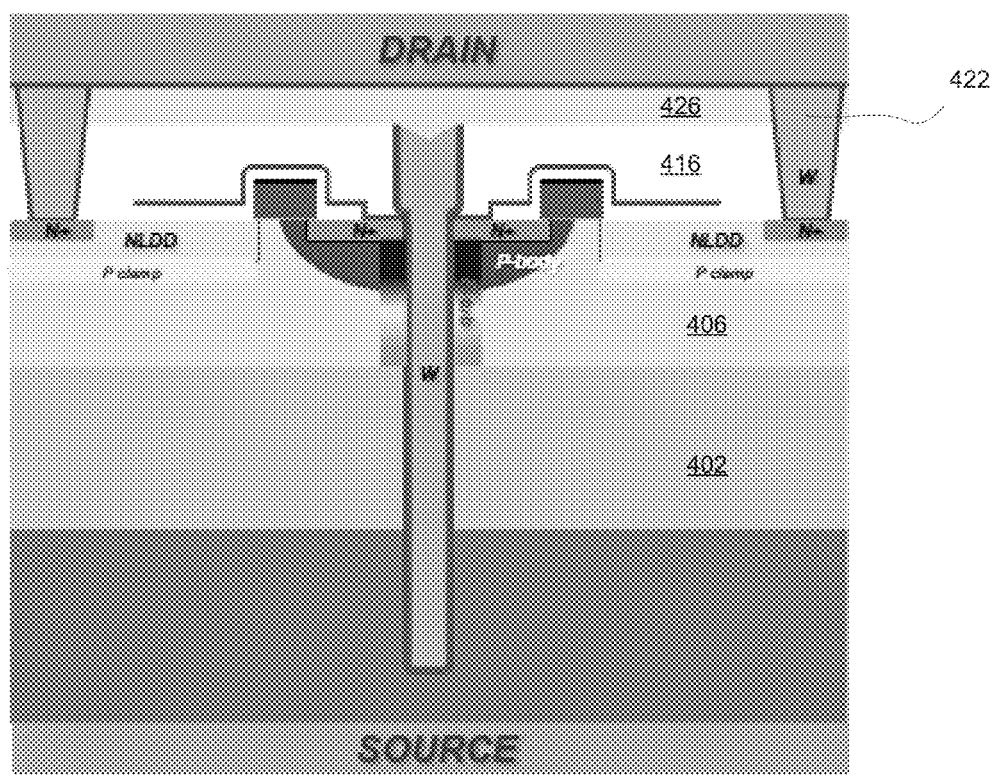

FIG. 4I is a diagram showing a cross section of a final stage 400I in the fabrication of a power MOSFET. As shown, a low temperature oxide (LTO) layer (not shown) and TEOS layer 416 are deposited. A BPSG layer 426 may be deposited over the upper surfaces of the feed-through element 420 and the TEOS layer 416, and annealed to stabilize those materials.

In one embodiment, a photolithographic process can be used to selectively deposit photoresist (not shown) in areas outside the drain contact region. A plasma etch is then used to etch away the oxide (e.g., TEOS layer 416) and form a trench. After cleaning the wafer and using a dilute HG last pretreatment, a barrier layer that lines the trench and extends over the surface of the BPSG 426 is formed by depositing a Ti layer and a TiN layer. A rapid thermal anneal can be used to form a titanium-silicide contact. A CVD tungsten layer can be deposited to a thickness sufficient for completely filling the trench and forming the drain contact 422. Gate contact (not shown) can be formed in a similar manner.

A metal layer is then formed. For example, in one embodiment a titanium layer and a thick aluminum layer can be deposited. A photolithographic process can be used to selectively deposit photoresist (not shown) over the metallization area, and a plasma etch can be used to remove the aluminum and titanium layers outside those areas.

As a result, a LDMOS structure such as that illustrated in FIG. 4I is formed. FIG. 4I illustrates a portion of a semiconductor device according to embodiments of the present invention. The device shown in FIG. 4I can be configured as a flip-chip.

Thus, according to embodiments of the present disclosure, an LDMOS structure is described that includes one or more tub regions for reducing the lateral resistance in a body area, and/or clamp regions under the drain for promoting a vertical avalanche current path.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples in that many architectural variants can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the present disclosure are thus described. While the present disclosure has been described in particular embodiments, it should be appreciated that the disclosure should not be construed as limited by such embodiments, but rather construed according to the below claims.

What is claimed is:

1. A semiconductor device, comprising:
   an epitaxial layer located over a doped substrate layer, said epitaxial layer comprising a source region and a drain region, said epitaxial layer further comprising a body structure;
   a gate structure above said epitaxial layer;
   an electrically conductive trench-like feed-through element comprising a barrier layer, wherein said trench-like feed-through element passes through said epitaxial layer and also contacts said substrate layer and said source region; and
   a first tub region under said source region and extending laterally under said gate structure, and adjacent laterally to and in contact with said body structure, and wherein said first tub region is in contact with said trench-like feed-through element.

2. The semiconductor device of claim 1, further comprising a second tub region located at least partially below said first tub region and extending laterally under said gate structure.

3. The semiconductor device of claim 2, wherein said second tub region contacts said substrate layer.

4. The semiconductor device of claim 2, wherein said body structure is less doped than said first tub region, and wherein said second tub region is less doped than said first tub region.

5. The semiconductor device of claim 1, further comprising a first clamp region located under said drain region.

6. The semiconductor device of claim 5, further comprising a second clamp region located under said drain region.

7. The semiconductor device of claim 6, wherein said first clamp region is less doped than said second clamp region.

8. The semiconductor device of claim 6, wherein said first clamp region and said second clamp region extend laterally from said drain region toward said gate structure, and wherein said second clamp region extends further laterally toward said gate structure than said first clamp region.

9. The semiconductor device of claim 1, wherein said drain region comprises:
   a first doped region accessible to a drain contact; and
   a second doped region located at least partially under said first region in said epitaxial layer, wherein said second doped region is less doped than said first doped region and wherein said second doped region separates said first doped region and said first clamp region.

10. The semiconductor device of claim 9, further comprising a first clamp region that is coarsely aligned with an edge of said first doped region.

11. The semiconductor device of claim 9, further comprising a first clamp region that is coarsely aligned within an edge of said second doped region.

12. A semiconductor transistor structure, comprising:
   a substrate of a first conductivity type;
   an epitaxial layer adjacent to said substrate;
   a gate structure located above said epitaxial layer,
   a drain region of a second conductivity type within said epitaxial layer;
   a source region of said second conductivity type within said epitaxial layer;
   a body structure of said first conductivity type within said epitaxial layer at least partially formed under said gate structure and extending laterally under said source region;
   an electrically conductive trench-like feed-through element comprising a barrier layer, wherein said trench-like feed-through element passes through said epitaxial layer and contacts said substrate and also passes through and contacts said source region; and
   a first tub region of said first conductivity type located under said source region and under said gate structure, and adjacent laterally to and in contact with said body structure, and in contact with said trench-like feed-through element.

13. The semiconductor transistor structure of claim 12, wherein said body structure is less doped than said first tub region.

14. The semiconductor transistor structure of claim 12, further comprising a second tub region formed at least partially below said first tub region and extending laterally under said gate structure, wherein said second tub region is less doped than said first tub region.

15. The semiconductor transistor structure of claim 14, wherein said second tub region contacts said substrate.

16. The semiconductor transistor structure of claim 12, wherein said drain region comprises:
   a first region accessible to a drain contact and spaced apart from said gate structure; and
   a second region and located at least partially under said first region within said epitaxial layer, wherein said second region extends to at least partially under said gate structure, wherein said second region is less doped than said first region, wherein said second region is coarsely aligned with an edge of said gate structure.

17. The semiconductor transistor structure of claim 16, further comprising a first clamp region of said first conductivity type located under said drain region and coarsely aligned with an edge of said first region of said drain region.

18. The semiconductor transistor structure of claim 17, further comprising a second clamp region of said first conductivity type located under said drain region, wherein said first clamp region and said second clamp region extend laterally from said drain region toward said gate structure, and wherein said second clamp region extends further laterally toward said gate structure than said first clamp region.

19. The semiconductor transistor structure of claim 16, further comprising a first clamp region of said first conductivity type located under said drain region and coarsely aligned with an edge of said second region of said drain region.

20. The semiconductor transistor structure of claim 19, further comprising a second clamp region of said first conductivity type located under said drain region, wherein said first clamp region and said second clamp region extend laterally from said drain region toward said gate structure, and wherein said second clamp region extends further laterally toward said gate structure than said first clamp region.

* * * * *